United States Patent [19]

Shirato

[11] Patent Number: 4,530,150

[45] Date of Patent: Jul. 23, 1985

[54] METHOD OF FORMING CONDUCTIVE CHANNEL EXTENSIONS TO ACTIVE DEVICE REGIONS IN CMOS DEVICE

[75] Inventor: Takehide Shirato, Hiratsuka, Japan

[73] Assignee: Fujitsu Limited, Kawasaki, Japan

[21] Appl. No.: 534,132

[22] Filed: Sep. 20, 1983

[30] Foreign Application Priority Data

Sep. 20, 1982 [JP] Japan ................. 57-163473

[51] Int. Cl.³ ................... H01L 29/02; H01L 21/265
[52] U.S. Cl. .................... 29/576 B; 29/571; 148/1.5; 148/187; 357/42; 357/91
[58] Field of Search ............ 29/576 B, 571; 148/1.5, 148/187; 357/42, 91

[56] References Cited

U.S. PATENT DOCUMENTS

| | | | |
|---|---|---|---|
| 4,213,142 | 7/1980 | McElroy | 357/91 |
| 4,235,011 | 11/1980 | Butler et al. | 29/571 |
| 4,306,915 | 12/1981 | Shiba | 148/1.5 |
| 4,325,169 | 4/1982 | Ponder et al. | 29/571 |
| 4,342,149 | 8/1982 | Jacobs et al. | 29/576 B |
| 4,346,512 | 8/1982 | Liang et al. | 29/571 |
| 4,354,307 | 10/1982 | Vinson et al. | 29/571 |
| 4,366,613 | 1/1983 | Ogura et al. | 29/571 |
| 4,385,947 | 5/1983 | Halfacre et al. | 148/187 |
| 4,433,468 | 2/1984 | Kawamata | 29/571 |
| 4,490,736 | 12/1984 | McElroy | 29/571 |

OTHER PUBLICATIONS

Bassous et al., IBM-TDB, 22 (1980) 5146.

Primary Examiner—Upendra Roy
Attorney, Agent, or Firm—Staas & Halsey

[57] ABSTRACT

A method for producing a semiconductor device which includes forming, in a well having the first conductivity type and selectively provided in a semiconductor substrate having a second conductivity type opposite the first conductivity type, two first impurity diffusion regions having the second conductivity type. In an exposed surface region of the substrate, the two second impurity diffusion regions, respectively, forming, in the well and the exposed surface region of the substrate, a third impurity diffusion region by implanting impurity ions having a P-type or N-type into the semiconductor substrate. The method also includes forming an electric current channel either between the two first impurity diffusion regions or between the two second impurity diffusion regions, thereby forming various integrated circuits by changing the wiring channel.

11 Claims, 14 Drawing Figures 4,530,150

METHOD OF FORMING CONDUCTIVE CHANNEL EXTENSIONS TO ACTIVE DEVICE REGIONS IN CMOS DEVICE

BACKGROUND OF THE INVENTION (1) Field of the Invention

The present invention relates to a method for producing a semiconductor device, more particularly to a method for producing a complementary metal-insulator-semiconductor (MIS) type integrated circuit device (IC) having general-purpose output stages.

(2) Description of the Prior Art

Rather than manufacture specialized IC's for each order from a customer, it is well known to manufacture a general-purpose IC and then customize it to the desired functions. Specifically, general-purpose IC's are produced in advance up to the diffusion process step by a common pattern, and are later customized have specific functions by employing various masking processes. This technique, known as the master slice process, enables significant reductions in design time and labor and in manufacturing costs as well as speedier delivery to customers.

Customization is usually effected either by first forming common contact windows on the general-purpose IC and then forming specific wiring patterns by using of different wiring masks or by forming specific contact window patterns by using of different contact window masks and then forming common wiring patterns.

Now, a complementary MIS IC such as a microcomputer includes a number of logic circuits. Some of the logic circuits have output circuits. In each output circuit, the final output-stage transistor is designed to be either an N-channel open-drain output type, i.e., a type in which current flows out from an output pad, or a P-channel open-drain output type, i.e., a type in which current flows into an output pad.

Depending on whether an N-channel or a P-channel open-drain type is required, it has sometimes it is necessary in conventional processes to change the mask to form the desired diffusion region in the final output-stage transistor.

SUMMARY OF THE INVENTION

An object of the present invention is to eliminate the above-mentioned problems.

Another object of the present invention is to provide a method for producing a complementary MIS IC in which two different functions can be achieved without employing masking processes.

Still another object of the present invention is to provide a complementary MIS IC having a lower cost end made by fewer production steps.

A still further object of the present invention is to provide a method for producing a complementary MIS IC in which two different functions can be achieved using a simple masking film.

To attain the above objects, there is provided a method for producing a semiconductor device which includes the steps of forming, in a well having a first conductivity type and selectively provided in a semiconductor substrate having a second conductivity type opposite the first conductivity type, two first impurity diffusion regions having the second conductivity type and, in an exposed surface region of the substrate, two second impurity diffusion regions having the first conductivity type. The method also includes forming, in the well and the exposed surface region of the substrate, a third impurity diffusion region, by implanting impurity ions having a P-type or N-type into the semiconductor substrate and forming an electric current channel between the two first impurity diffusion regions or between the two second impurity diffusion regions forming various IC's by changing the wiring channel.

BRIEF DESCRIPTION OF THE DRAWINGS

The above and other objects and advantages of the present invention will be more apparent from the following description of the preferred embodiments with reference to the accompanying drawings, wherein.

DESCRIPTION OF THE PREFERRED EMBODIMENTS

Embodiments of the present invention will now be described with reference to the drawings.

Figure 1A:
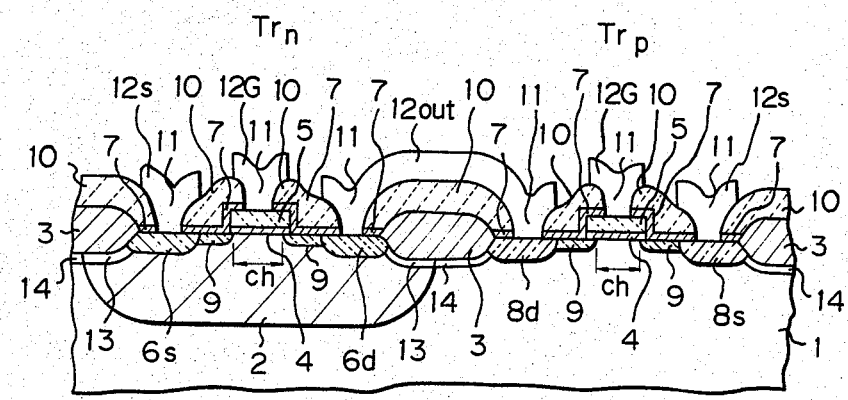
FIG. 1A is a cross-sectional view of a semiconductor device produced by an embodiment of the process of the present invention.

FIG. 1A is a cross-sectional view of a final-output stage of an N-channel open-drain type in a complementary MIS IC produced by the method according to the present invention. In FIG. 1A, reference numeral 1 represents an N-type silicon substrate; 2 a P$^-$-type well; 3 a field oxide film; 4 a gate oxide film; 5 a polycrystalline silicon gate electrode; 6s an N$^+$-type source region; 6d an N$^+$-type drain region; 7 an oxide film; 8s a P$^+$-type source region; 8d a P$^+$-type drain region; 9 an N-type low concentration diffusion region; 10 a phospho-silicate glass film (PSG); 11 electrode-contact window; 12out output wiring; 12S source wiring; 12G gate wiring; 13 a channel cut region of an N-channel MIS field effect transistor; 14 a channel cut region of a P-channel MIS field effect transistor; ch a channel region; Trn an N-channel MIS field effect transistor; and Trp a P-channel MIS field effect transistor.

Figure 1B:
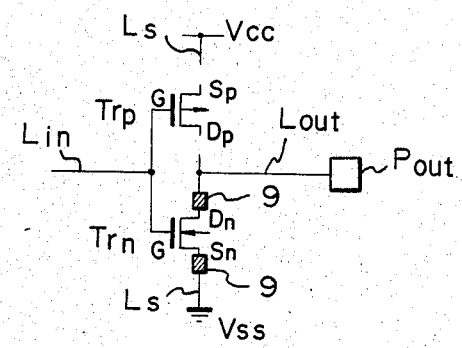
FIG. 1B is a circuit diagram of the circuit of FIG. 1A.

FIG. 1B is a diagram of the circuit of the final-output stage shown in FIG. 1A. In FIG. 1B, reference Trn represents the N-channel MIS field effect transistor; Trp the P-channel MIS field effect transistor; G a gate; Sn an N$^+$-type source; Dn an N$^+$-type drain, Sp a P$^+$-type source; Dp a P$^+$-type drain; Vcc a power supply or supplies; Vss ground; Lin the gate wiring or input wiring; Ls the source wiring; Lout the output wiring; Pout an output pad; and 9 the N-type low concentration diffusion region.

As shown in FIGS. 1A and 1B, the N-channel MIS field effect transistor Trn is connected to the P-channel MIS field effect transistor Trp in parallel. Both transistors Trn and Trp have source and drain regions spaced away from the channel region ch.

In the structure produced by the first embodiment of the present invention, the N-type low concentration diffusion region 9 is formed in the surface of the P⁻-type well 2 and the N-type silicon substrate 1, which are respectively formed between the source and drain regions 6s, 6d, and 8s, 8d and the channel region ch. The N-type low concentration diffusion region 9 forms a current channel, i.e., wiring, in the N-channel MIS field effect transistor Trn. The low concentration diffusion region 9 does not, on the other hand, form a current channel in the P-channel MIS field effect transistor Trp. Therefore, the IC of the above embodiment is an N-channel open-drain output type.

Figure 2A:
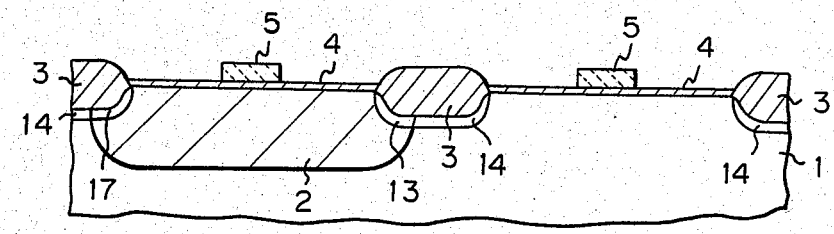
FIGS. 2A to 2G are cross-sectional views of the semiconductor device of FIG. 1A showing an embodiment according to the process of the present invention.

FIGS. 2A to 2G are cross-sectional views illustrating an embodiment of a method by which the structure shown in FIG. 1A is produced. In FIG. 2A, a semiconductor substrate having a structure formed by a well-known process for producing a conventional complementary MIS IC, is prepared. In the figure, parts the same as in FIG. 1A are given the same reference numerals.

Figure 2B:
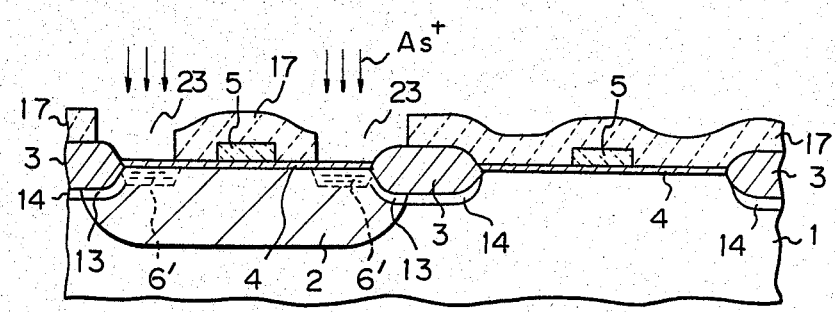

Referring to FIG. 2B, a first resist film 17 having openings or windows 23 is formed on the semiconductor substrate by a well-known photo process. Then, the first resist film 17 is used as a masking material to selectively implant N-type impurity ions, for example, arsenic ions, into the surface of the P⁻-type well 2 at a high concentration. In FIG. 2B, reference As+ represents arsenic ions and 6' a high concentration arsenic ion (N-type impurity) implantation region.

Figure 2C:
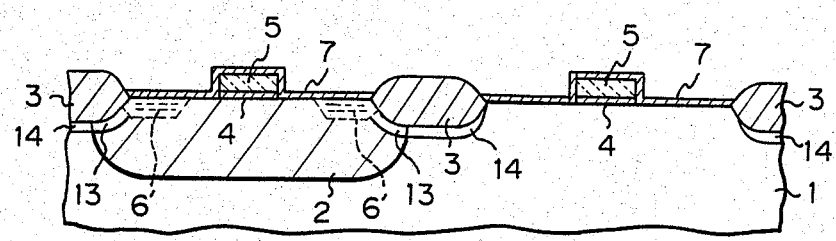

Next, referring to FIG. 2C, the first resist film 17 and the exposed gate oxide film 4 are removed. The oxide film 7 is then formed at a thickness of approximately 500 Å on the surface of the N-type silicon substrate 1, the surface of the P⁻-type well 2, and the surface of the polycrystalline silicon gate electrode 5 by a well known thermal oxidation process.

Figure 2D:
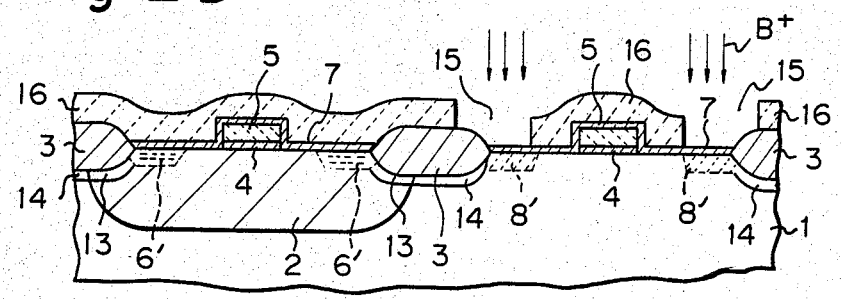

Referring now to FIG. 2D, a second resist film 16 having openings or windows 15 is then formed on the semiconductor substrate by a well known photo process. The second resist film 16 is then used as a masking material to selectively implant P-type impurity ions, for example, boron or indium ions, into the surface of the N-type silicon substrate 1 at a high concentration. In FIG. 2D, reference B+ represent boron ions and 8' a high concentration boron ion (P-type impurity) implantation region.

Figure 2E:
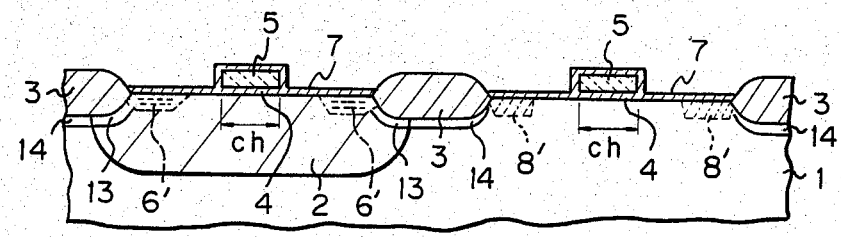

Then, the second resist film 16 is removed, obtaining the structure shown in FIG. 2E. In this structure, the channel region is spaced away from the N+-type source and drain regions 6' and also the high concentration P-type impurity ion implantation region 8'. Therefore, no transistor is electrically conductive.

The semiconductor substrate having the structure shown in FIG. 2E is stored until an order from a customer. Then, in accordance with the output-type required, N-type or P-type impurity ions are implanted into the entire surface of the semiconductor substrate, without using a mask, to cause electric conductance to one of the transistors and form an output wiring having the required output type.

Figure 2F:
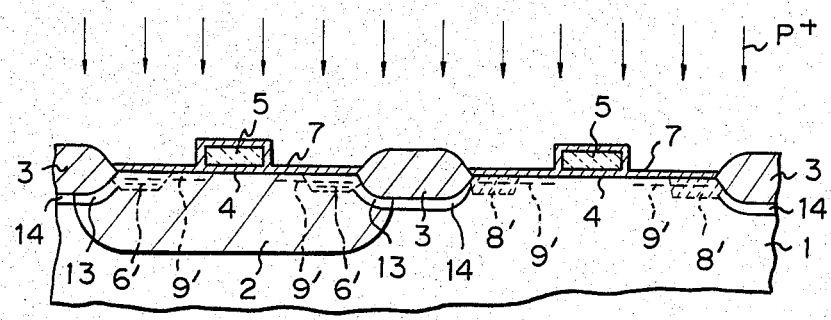

Namely, when an N-channel open-drain output type IC is required by a customer, for example, arsenic or phosphorus ions are implanted into the entire surface of the semiconductor substrate at a low concentration as shown in FIG. 2F. For phosphorus ion implantation, a does of $10^{12}$ to $10^{13}$ atm/cm² and implantation energy of about 100 KeV are preferable. In FIG. 2F, reference P+ represents phosphorus ions and 9' a low concentration phosphorus ion implantation region.

Figure 2G:
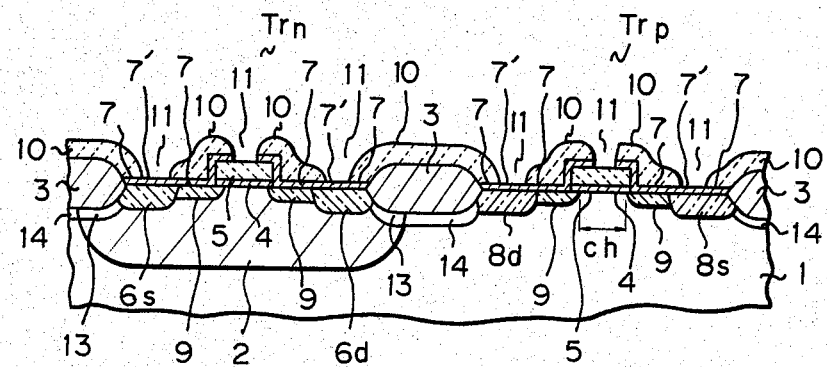

Then, as shown in FIG. 2G, the PSG film 10 is formed on the substrate. After that, the electrode-contact window 11 is formed by photolithography, using a conventional mask. Then, thin oxide film 7' is formed in the electrode contact window 11 to prevent out-diffusion from the PSG film 10 during the high temperature annealing treatment. The desired annealing treatment is carried out to define the depths of the source and drain region. The high concentration P-type impurity ion implantation region 8' counterbalances the low concentration N-type impurity ions, i.e., phosphorus ions implanted therein, so that the region 8' acts as the P+-type source region 8s and the P+-type drain region 8d. In the exposed P-type well 2 and the N-type silicon substrate 1, the N-type low concentration diffusion region 9 is formed.

Thus, only the N-channel MIS field effect transistor Trn can be turned on. However, the P-channel Trp can not be turned on since the low concentration N⁻-type region is formed between the source drain regions and the gate electrode. In FIG. 2G, reference Trp represents the P-channel MIS field effect transistor.

The thin oxide film 7' in the electrode contact window 11 is then removed by an etching process. Wiring composed of aluminum is formed on the PSG film 10 by a well known process thereby producing the complementary MIS IC having an N-channel open-drain output type shown in FIG. 1A.

To produce an IC having a P-channel open-drain output type, boron or indium ions are preferably used for the ion implantation as shown in FIG. 2F.

According to the present invention, the wiring channel is changed by changing the ions of the impurity diffusion layer formed in the semiconductor substrate. Thus, the master slice process of a complimentary MIS IC which forms two or more IC's having different functions can be obtained.

Figure 3:
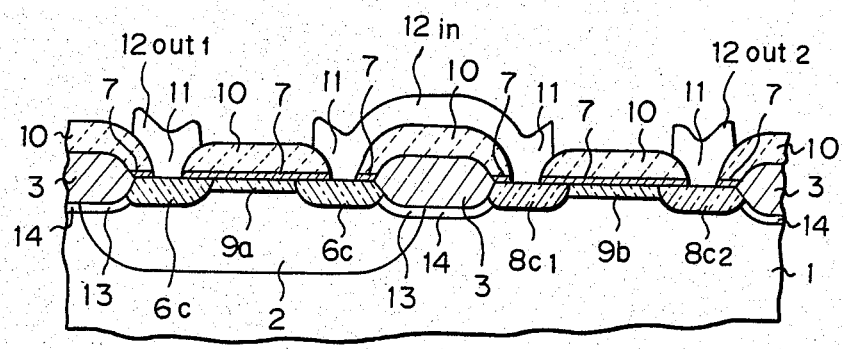
FIG. 3 is a cross-sectional view of a semiconductor device produced in accordance with another embodiment of the process of the present invention.

FIG. 3 is a cross-sectional view of a semiconductor device produced by another embodiment of the process of the present invention. In FIG. 3, the wiring channel is changed using a resistance layer. A junction is formed between the P+-type contact regions $8c_1$ and $8c_2$ and the N-type resistance layer 9b, so that the current flow is broken. Thus, the wiring channel is formed through the resistance layer 9a positioned in the P-type well 2 to the output wiring 12out.

In FIG. 3, parts the same as in FIGS. 1A and 2A to 2G are given the same reference numerals. Reference numeral 6C is an N+-type contact region; 12in input wiring; and 12out₁, 12out₂ output wiring.

FIGS. 4A to 4D are cross-sectional views of another embodiment of the process according to the present invention.

Figure 4A:
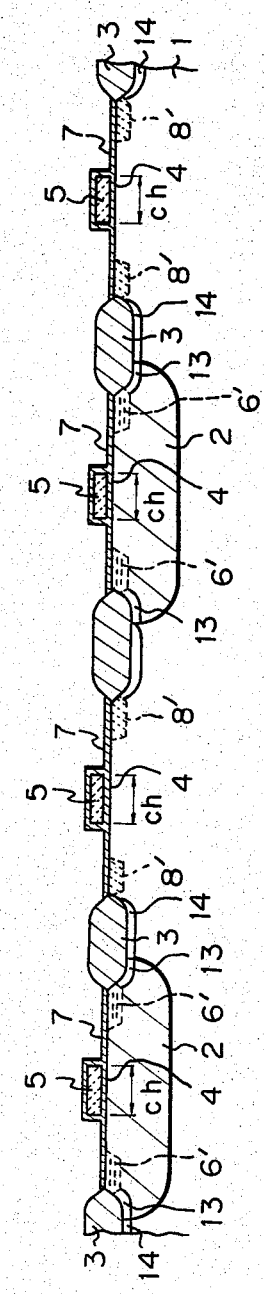
FIGS. 4A to 4D are cross-sectional views of the semiconductor device in FIG. 3 showing another embodiment of a semiconductor device produced by the process according to FIGS. 2A–2E of the present invention.

A structure shown in FIG. 4A is produced by the same processes shown in FIGS. 2A to 2E. The structure in FIG. 4A is the same as two structures of FIG. 2E continuously and laterally placed. The structure is produced in advance and stored until a customer order is received.

Figure 4B:
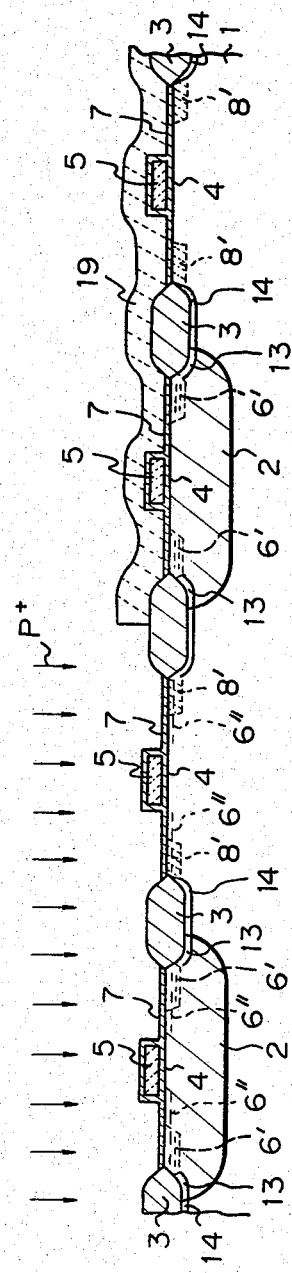

After the output type required by a customer is determined, the process is continued. In FIG. 4B, N-type impurity ions, for example, arsenic or phosphorus ions having a low concentration, are implanted into the semiconductor substrate using a third resist film 19 as a mask on the right half side of the structure. Thus, an N-channel open-drain output type IC is formed in the left side. For phosphorus ion implantation, a dose of $10^{12}$ to $13^{13}$ atm/cm² and implantation energy of approximately 100 KeV are preferable. In FIG. 4B, reference P+ represents phosphorus ions and 6" a low concentration phosphorus ion implantation region.

Figure 4C:
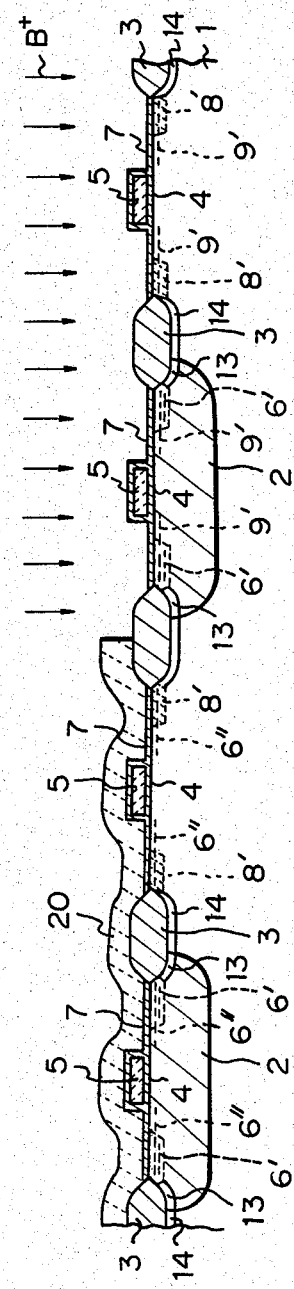

In FIG. 4C, the third resist film 19 is then removed, and low concentration P-type impurities, for example, boron or indium ions having a low concentration, are implanted into the semiconductor substrate using a fourth resist film 20 as a mask on the left half side of the structure. Thus, a P-channel open-drain output type IC is formed on the right side. For boron ion implantation, a dose of $10^{12}$ to $10^{13}$ atm/cm$^2$ and implantation energy of approximately 30 KeV are preferable. At the side of the transistor having no conductive path, opposite type impurities are inevitably implanted to suppress the inversion as mentioned above. In FIG. 4C, reference B+ represents boron ions and 9' a low concentration boron ion implantation region.

Figure 4D:
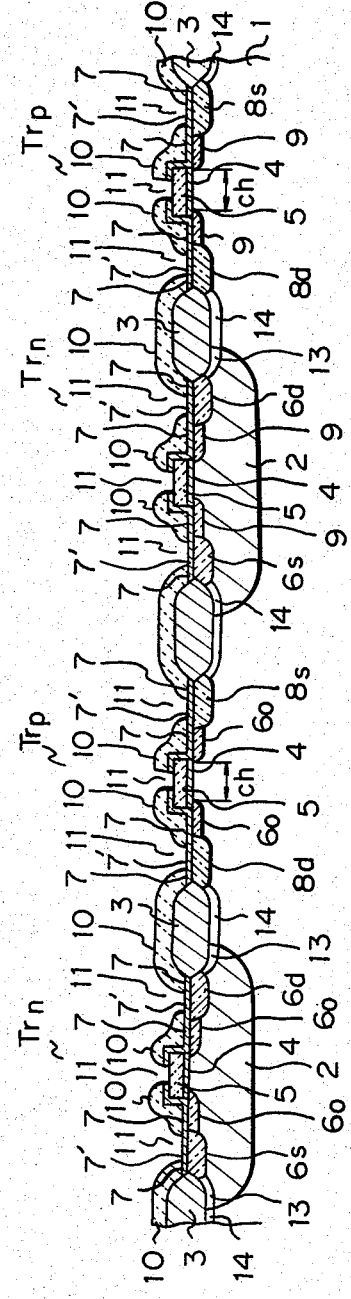

The fourth resist film 20 is then removed, and the PSG film 10 is formed over the substrate as shown in FIG. 4D. Then, the electrode contact window 11 is formed by a well known photolithography process. Subsequently, the same processes are carried out as explained in FIGS. 2G and 1A. Thus, a MIS IC having an N-channel open-drain output type and P-channel open-drain output type can be obtained.

It should be noted that according to this invention, it is also possible to prevent third parties from understanding the logic or code from the external wiring arrangement.

I claim:

1. A method for producing a semiconductor device having a semiconductor substrate of a first conductivity type and having a well of a second conductivity type opposite the first conductivity type and selectively formed in the semiconductor substrate, comprising the steps of:
    (a) forming, in the well, two first impurity regions having the first conductivity type;
    (b) forming in an exposed surface region of the substrate, two second impurity regions having the second conductivity type; and
    (c) forming, in the well and the exposed surface region of the substrate, a third impurity region by implanting impurity ions of one of the first or second conductivity type into the semiconductor substrate to selectively form an electric current channel between one of the two second impurity regions and the two first impurity regions, so that integrated circuits can be formed by changing the electric current channel, the impurity ions of the third region being simultaneously introduced into a region between the two first impurity regions and a region between the two second impurity regions.

2. A method according to claim 1, wherein said step (b) comprises forming the second impurity regions using arsenic or phosphorus.

3. A method according to claim 1, wherein said step (a) comprises forming the first impurity regions using boron or indium.

4. A method according to claim 1, wherein said step (c) comprises forming the third impurity regions using arsenic or phosphorus.

5. A method according to claim 1, wherein said step (c) comprises forming an integrated circuit of a N-channel open-drain output type employing said electric current channel.

6. A method according to claim 1, wherein said step (c) comprises forming an integrated circuit of a P-channel open-drain output type employing said electric current channel.

7. A method according to claim 1, wherein said step (c) comprises forming integrated circuits of both N-channel open-drain types and P-channel open-drain types by implanting impurities of both the first and second conductivity types into the semiconductor substrate.

8. A method according to claim 1, wherein said step (c) comprises forming a resistance layer from the electric current channel.

9. A method according to claim 2, wherein said step (b) comprises implanting phosphorus at a dose of $10^{12}$ to $10^{13}$ atm/cm$^2$ and an energy of substantially 100 KeV.

10. A method according to claim 3, wherein said step (a) comprises implanting boron or indium at a dose of $10^{12}$ to $10^{13}$ atm/cm$^2$ and an energy of substantially 30 KeV.

11. A method according to claim 4, wherein said step (c) comprises implanting phosphorus at a dose of $10^{12}$ to $10^{13}$ atm/cm$^2$ and an energy of substantially 100 KeV.

* * * * *

UNITED STATES PATENT AND TRADEMARK OFFICE
CERTIFICATE OF CORRECTION

PATENT NO. : 4,530,150
DATED : JULY 23, 1985
INVENTOR(S) : TAKEHIDE SHIRATO

It is certified that error appears in the above-identified patent and that said Letters Patent is hereby corrected as shown below:

Col. 1, line 19, after "customized" insert --to--;
line 27, delete "of";
line 29, delete "of";
line 54, "end" should be --and--.

Col. 3, line 65, "does" should be --dose--.

Signed and Sealed this

Twenty-ninth Day of October 1985

[SEAL]

Attest:

DONALD J. QUIGG

Attesting Officer

Commissioner of Patents and
Trademarks—Designate